United States Patent [19]

Kunikiyo et al.

[11] Patent Number: 5,067,101

[45] Date of Patent: Nov. 19, 1991

[54] TOPOGRAPHY SIMULATION METHOD

[75] Inventors: Tatsuya Kunikiyo; Masato Fujinaga; Norihiko Kotani, all of Itami, Japan

[73] Assignee: Mitsubishi Denki Kabushiki Kaisha, Japan

[21] Appl. No.: 410,723

[22] Filed: Sep. 21, 1989

[30] Foreign Application Priority Data

Nov. 29, 1988 [JP] Japan ................................ 63-302857

[51] Int. Cl.$^5$ ............................................ G06F 15/72
[52] U.S. Cl. .................................... 364/578; 364/488
[58] Field of Search ......... 364/521, 522, 578, 488–491; 371/27

[56] References Cited

U.S. PATENT DOCUMENTS

| | | | |
|---|---|---|---|
| 4,868,770 | 9/1989 | Smith et al. | 364/578 |
| 4,868,771 | 9/1989 | Quick et al. | 364/578 |
| 4,879,667 | 11/1989 | Gorski et al. | 364/578 |
| 4,888,583 | 12/1989 | Ligocki et al. | 364/522 |

OTHER PUBLICATIONS

Shephard: Finite Element Modeling Within an Integrated Geometric Modeling Environment: Part I–Mesh Generation, Engineering with Computers, pp. 61–70, Springer 1985.
Oldham et al., "A General Simulator ... Lithography", IEEE Transactions on Electron Devices, vol. ED–26, No. 4, Apr. 1979, pp. 717–722.
Hirai et al., "Three Dimensional Process ... Effects", IEEE Catalogue, No. 87th 0189–01, 1987, pp. 15–16.
Matsuzawa et al., "Three-Dimensional Photoresist ... Surfaces", IEEE Transactions on Electron Devices, vol. ED–32, No. 9, Sep. 1985, pp. 1781–1783.

Primary Examiner—Salvatore Cangialosi
Attorney, Agent, or Firm—Leydig, Voit & Mayer

[57] ABSTRACT

A topography simulation method enables estimation of the three-dimensional shape of a surface of a workpiece where material removal by a predetermined process takes place. This simulation method includes the steps of dividing a region of the workpiece to be removed into a plurality of partial regions; setting a diffusion coefficient for each partial region with a diffusion component contributing to material removal, and calculating a contour surface of the concentration of the diffusion component by a process which employs modified diffusion equations. The contour surface obtained the surface after material removal.

2 Claims, 19 Drawing Sheets

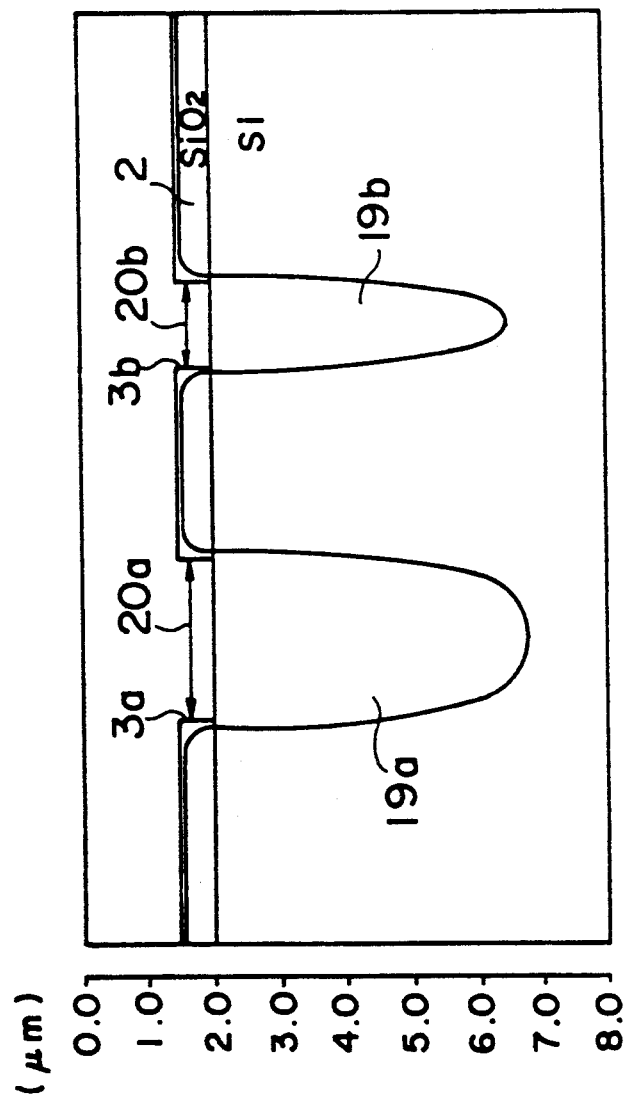

F I G. 15
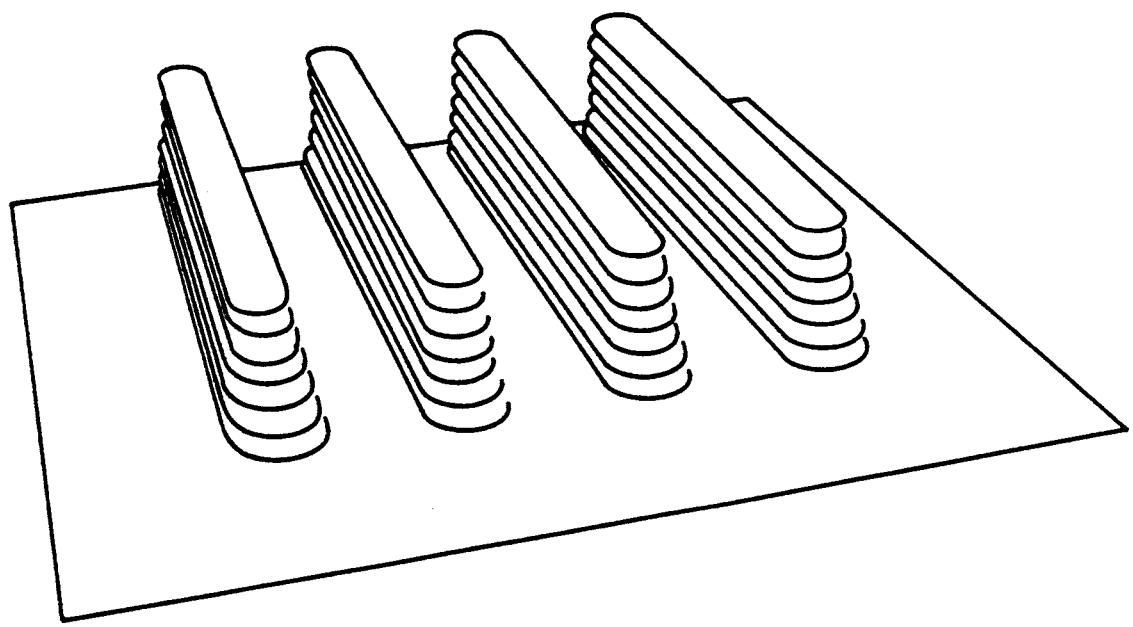

TOPOGRAPHY SIMULATION METHOD

BACKGROUND OF THE INVENTION

1. Field of the Invention

The present invention relates to a topography simulation method. More particularly, the present invention concerns a simulation method which enables estimation of the three-dimensional shape of a region of a workpiece to be removed in the manufacture of a semiconductor device.

2. Description of the Related Art

Simulation of, for example, an etched profile in etching is performed conventionally on the basis of the string model using a computer. FIG. 1 is a cross-sectional view of the shape of the surface to be etched which is obtained by simulation by means of the string model. In FIG. 1, reference numerals 1 and 2 denote a semiconductor substrate, and a resist, respectively. The resist 2 prevents the semiconductor substrate 1 from being etched. The semiconductor substrate 1 is selectively etched with this resist 2 as a mask. The shape of the surface to be etched is represented by a plurality of nodes 21 and segments 22 that connect the adjacent nodes 21. The etching is performed by advancing the individual nodes 21 in the direction indicated by arrows 23. Movement of the individual nodes 21 is determined at intervals of $\Delta t$ seconds, which is a short period of time. Each time they are determined, the corresponding two nodes 21 are connected with each other by the segment 22. At that time, the nodes 21 and the segments 22, must be controlled so that the length of the individual segments 22 does not become excessively long or short or so that the two segments 22 do not intersect.

FIG. 2 shows conceptually a control of the string which is applied to isotropic etching. Let the coordinates of three points 24, 25 and 26 on the surface to be etched at time $t_i$ be $(i, j-1)$, $(i, j)$ and $(i, j+1)$, respectively. The point 25 moves to and is located at point 27 having the coordinates $(i+1, j)$ $\Delta t$ seconds after time $t_i$, which is time $t_i + 1$. Assuming that etching propagates at this time at an etching velocity of $(i, v)$, the relation between the points 25 and 27 is expressed by the following equation.

$$(i+1, j) = (i, j) + (i, v) \times \Delta t.$$

Where $(i, j \to j-1)$ is a vector 29 which is directed from the point 25 to the point 24 at time $t_i$, $(i, j \to j+1)$ is a vector 30 which is directed from the point 25 to the point 26, and $|i, j \to j-1|$ and $|i, j \to j+1|$ are respectively the magnitudes of the vectors 29 and 30, the direction of the etching velocity 28 is determined by:

$$-\frac{|i, j \to j+1|}{|i, j \to j-1| + |i, j \to j+1|} (i, j \to j-1)$$

$$-\frac{|i, j \to j-1|}{|i, j \to j-1| + |i, j \to j+1|} (i, j \to j+1)$$

The string model is thus controlled to enable simulation of, for example, a two-dimensional topography.

When this string model is applied to the simulation of a three-dimensional topography, the three-dimensional shape is represented by a plurality of small triangles, and movements of the individual triangles are determined at the intervals of $\Delta t$.

However, control of the dimension and the intersection of the individual triangles requires extremely complicated programming of a computer, long operation time and a large memory capacity, and this makes simulation of a three-dimensional topography using the string model substantially impossible.

SUMMARY OF THE INVENTION

Accordingly, the present invention is directed to eliminate the aforementioned problems of the prior art, and has an object providing a topography simulation method which enables estimation of the three-dimensional shape of the surface of a workpiece where removal takes place with a high degree of accuracy in a short period of time.

To this end, the present invention provides a topography simulation method which enables estimation of the three-dimensional shape of a surface of a workpiece where removal by a predetermined process takes place. This simulation method includes the steps of: dividing a region of the workpiece to be removed into a plurality of partial regions; setting a diffusion coefficient for each partial region with a component contributing to removal being a diffusion component; and calculating a contour surface of the concentration of the diffusion component by a process which employs a modified diffusion equation, the contour surface obtained defining a surface to be removed.

BRIEF DESCRIPTION OF THE DRAWINGS

FIG. 9 is a cross-sectional view of the simulation results of grooves formed when the windows of a mask have different size;

FIG. 10B is a plan view of a mask shown in FIG. 10A;

FIG. 10C shows the light intensity distribution on a photo resist film using the exposure device shown in FIG. 10A;

FIG. 11 shows the radiation impinging on a photo resist film;

FIG. 15 is a perspective view of the simulation results obtained in Example 3;

DETAILED DESCRIPTION OF THE PREFERRED EMBODIMENTS

Figure 1:
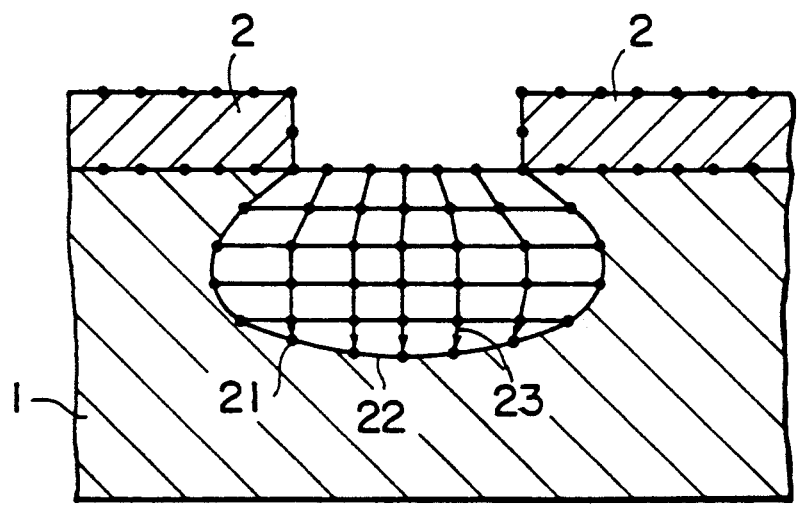
FIG. 1 is a cross-section of an etched profile conventionally simulated on the basis of the string model.
Figure 2:
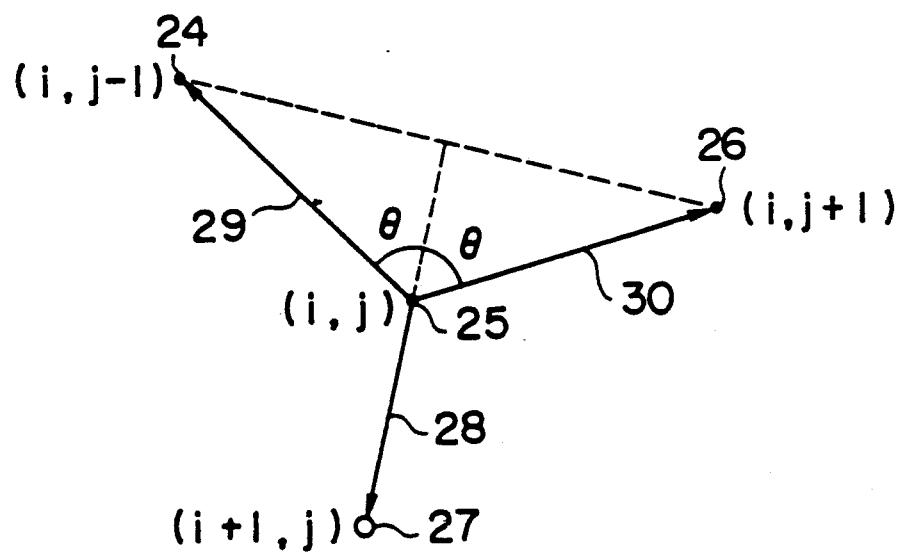
FIG. 2 shows the concept of control of the string which is to be performed when etching is isotropically conducted.
Figure 3:
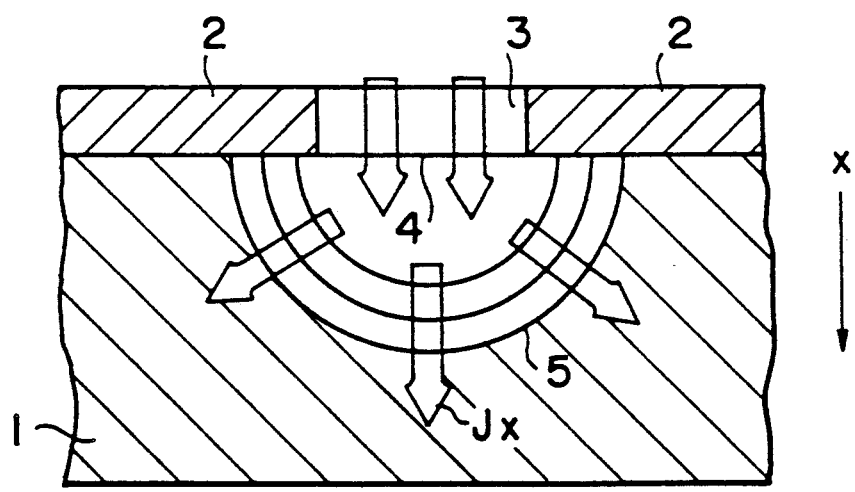
FIG. 3 shows the concept of a first embodiment of a simulation method according to the present invention.

Embodiments of the present invention will be described below with reference to the accompanying drawings FIG. 3 conceptually illustrates a simulation model applied to etching, showing a first embodiment of the present invention. Assuming that a chemical reaction occurs at a very high speed on the etching front and that the etching velocity therefore depends only on the flow velocity of diffusing etchant the mechanism of etching is modeled as follows.

Let the direction of the depth into the semiconductor substrate 1 be x. In the vicinity of the central portion 4 of the rear surface of a window 3 of the mask 2 formed on the semiconductor substrate 1, etching may be approximated as a one-dimensional phenomenon directed in the direction x. In consequence, if the flow velocity Jx of the etchant is proportional to the etching velocity Vx, following equation holds:

$$Vx = aJx \quad [1]$$
$$= dx/dt \quad [2]$$

When the etchant diffuses at a constant concentration CO at the rear surface of the window 3 of the mask 2, the distribution of the concentration of the etchant is expressed one-dimensionally by the following equation.

$$C(x,t) = CO \times \text{erfc}(x/2 \sqrt{Dx \cdot t}) \quad [3]$$

where $C(x,t)$ is distribution of the concentration, $Dx$ is the diffusion coefficient, erfc is the complementary error function, and $t$ is the diffusion time (time parameter relative to the etching time).

This gives the flow velocity Jx of the etchant as follows:

$$Jx = -Dx \partial c/\partial x \quad [4]$$

$$= (Dx \times CO/\sqrt{\pi Dxt}) \exp[-(x/2\sqrt{Dxt})^2] \quad [5]$$

The flow velocity of the etchant on the surface ($x=0$) of the mask 2 is therefore expressed as follows:

$$Jx = Co\sqrt{Dx/\pi t} \quad [6]$$

Next, movement of the contour surface 5 of the etchant concentration, i.e., the etched surface, will be considered. The contour surface 5 is expressed using Equation [3] as follows:

$$C(x, t) = C1 = \text{constant} \quad [7]$$

The contour surface 5 is also expressed using the inverse function, $\text{erfc}^{-1}$, of the complementary error function, erfc, as follows:

$$x = 2\sqrt{Dxt} \; \text{erfc}^{-1}(C1/CO) \quad [8]$$

The velocity of the contour surface 5, i.e., the etching velocity Vx, is obtained by differentiating Equation [8] by the diffusion time t as follows:

$$Vx = dx/dt \quad [9]$$
$$= \sqrt{Dx/t} \; \text{erfc}^{-1}(C1/CO)$$

It is clear from Equation [9] that the etching velocity Vx is proportional to the flow velocity Jx of the etchant on the surface of the mask 2, which is expressed by Equation [6].

Equation [9] is equivalent to Equation [1], and this means that movement of the etching front can be approximated by the movement of the contour surface of the diffusing etchant.

Figure 4:
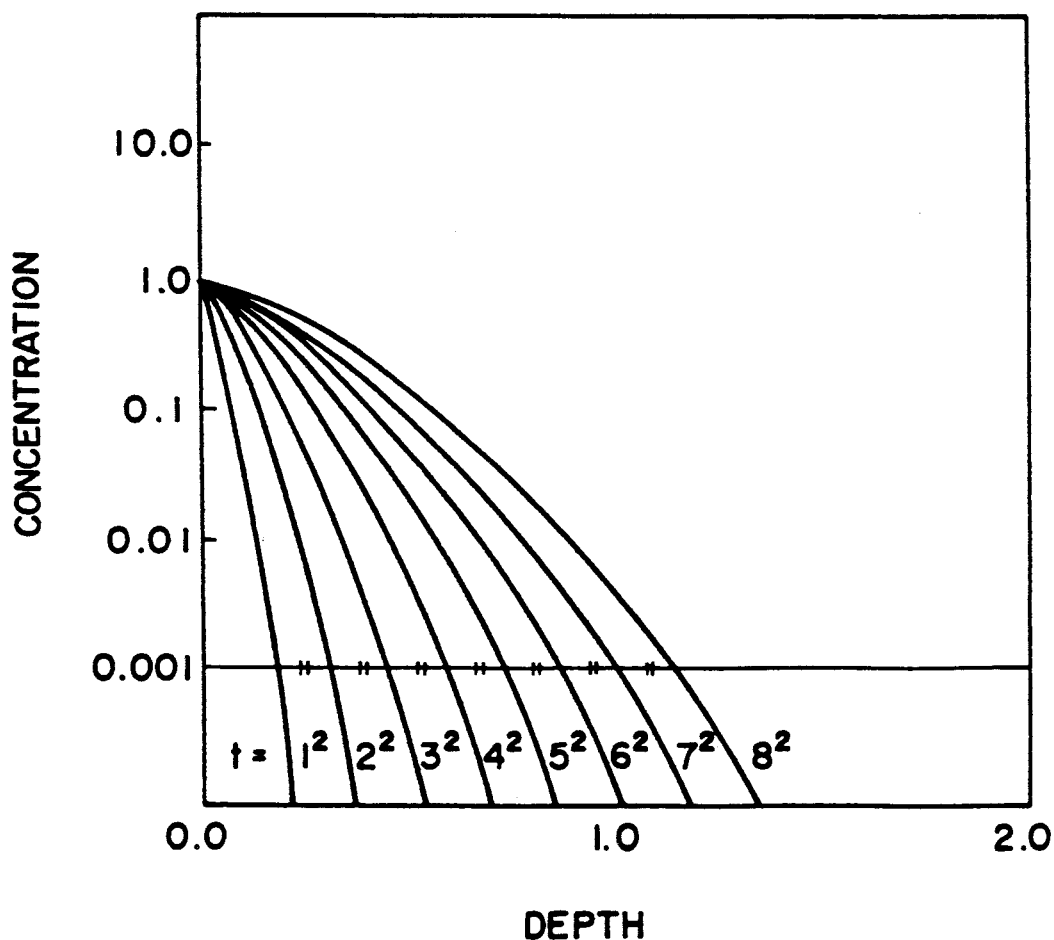
FIG. 4 is a graphical representation of the relation between diffusion time and a surface contour.

Next, the relationship between etching and diffusion phenomenon will be considered. Assuming that the diffusion time t varies as $$t = 1^2, 2^2, 3^2, \ldots, 8^2 \; (\text{min}) \quad [10],$$

it is clear from Equation [8] that the contour surface 5 moves in the depth direction (direction x) equidistantly, as shown in FIG. 4. In consequence, the etching velocity Vx, the diffusion coefficient Dx, the actual etching time T and the diffusion time t have the relationships expressed by Equations [11] and [12].

$$Vx = K1\sqrt{Dx} \quad [11]$$

$$T = K2\sqrt{t} \quad [12]$$

where K1 and K2 are proportionality constants.

The sequence of the above-described equations is referred to as modified diffusion equations, and a simulation model expressed by these modified diffusion equations is called the modified diffusion model.

The modified diffusion equations are expanded three-dimensionally as follows:

$$Vi = Ki\sqrt{Di} \quad [13]$$

$$T = K2\sqrt{t} \quad [14]$$

$$\partial C/\partial t = -\sum_i (\partial Ji/\partial i) \quad [15]$$

$$Ji = -Di(\partial C/\partial i) \quad [16]$$

$$i = x, y, z \quad [17]$$

Hence, when the proportionality constants K1 and K2 are set to adequate values and when the etching velocity Vi and the etching time T are given, Equations [13] to [17] can be solved. This solution gives one of the contour surfaces 5, which represent the three-dimensional shape of the surface etched. This algorithm can be applied to anisotropic, isotropic, inclined and other types of etching by determining Vx, Vy and Vz correspondingly.

Figure 5:
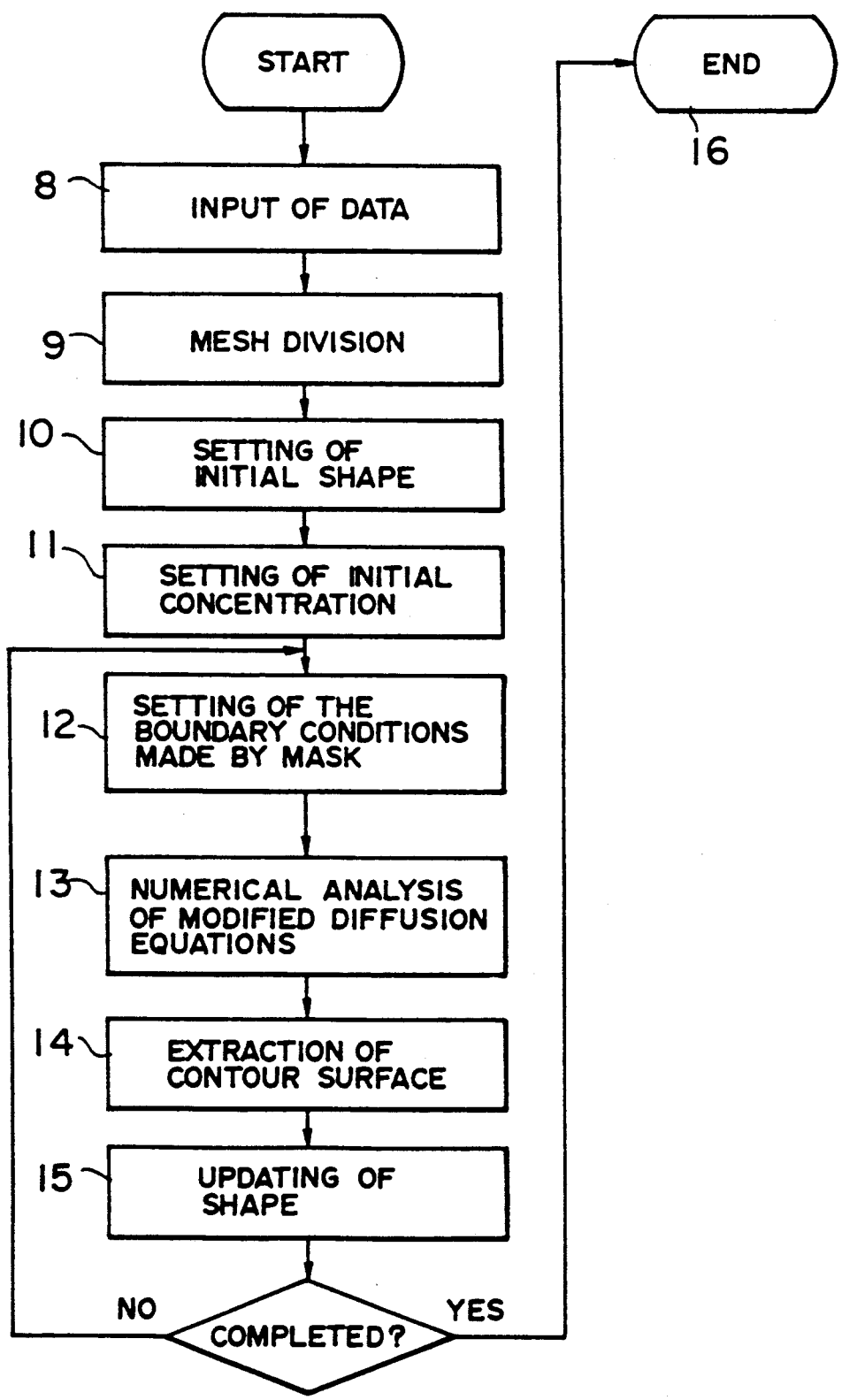
FIG. 5 is a flowchart of the calculation process in the first embodiment of the present invention.

FIG. 5 is a flowchart of the calculation process of such a simulation model. First, in step 8, data representing the etchant, the etching time T and so on is input, and then the space is divided into a plurality of points forming a mesh and providing a reference grid in step 9. Next, the initial shape of the semiconductor substrate 1 and that of the mask 2 are set in step 10, and then the initial concentration and the diffusion coefficient Di of the etchant are set in step 11. Setting of the diffusion coefficient Di determines the type of etching, either the anisotropic or isotropic etching. Subsequently, in step 12, the boundary conditions determined by the window 3 of the mask 2 are set. At this time, either constant concentration or constant flow velocity is selected. The boundaries determined by other parts of the semiconductor substrate are all natural boundaries.

Next, in step 13, the modified diffusion equations are numerically analyzed on the basis of the above-described initializations using the finite-difference method. From the results of this numerical analysis, the contour surface 5 of the etched object is extracted in step 14, and in step 15, the etched profile updated by the contour surface 5 is obtained. Thereafter, the processes of steps from 12 to 15 are repeated to simulate the etched profile successively, i.e., as a function of time. When it is determined that the etching time T which is input in step 8 has elapsed, the processing goes from step 15 to step 16, thereby completing the simulation.

When the etched profile for a subsequent process is to be simulated successively, the conditions for the subsequent process are set.

From the results of the numerical analysis are created a mesh diagram, a cross-sectional view of an etched portion, a contour surface diagram, a vector diagram of the flow of the etchant, and perspective view (including a hidden-line removal) of the etched profile.

Next, examples of the simulations actually performed according to this embodiment of the present invention will be described below.

EXAMPLE 1: CONTACT HOLE

Figure 6A:
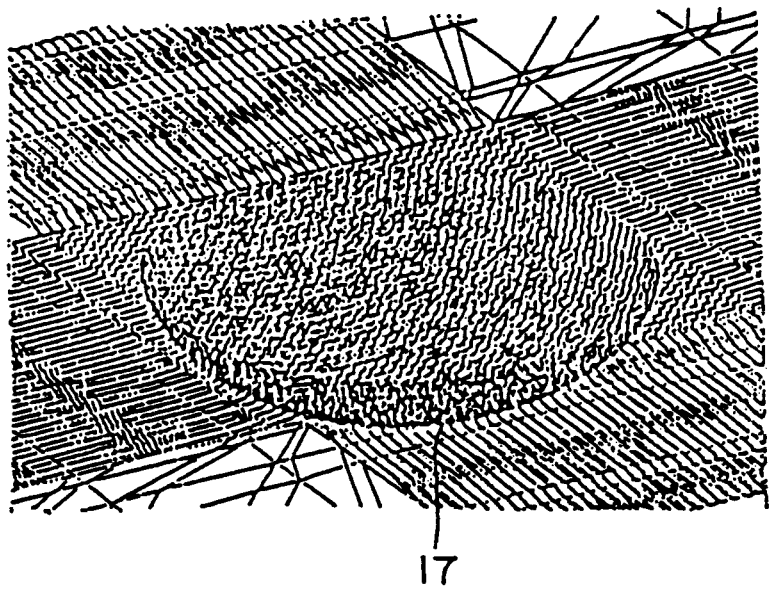
FIGS. 6A and 6B are respectively a perspective and a cross-sectional view of the simulation results of a wet-etched profile obtained in Example 1 which exemplifies the first embodiment of the present invention.
Figure 7A:
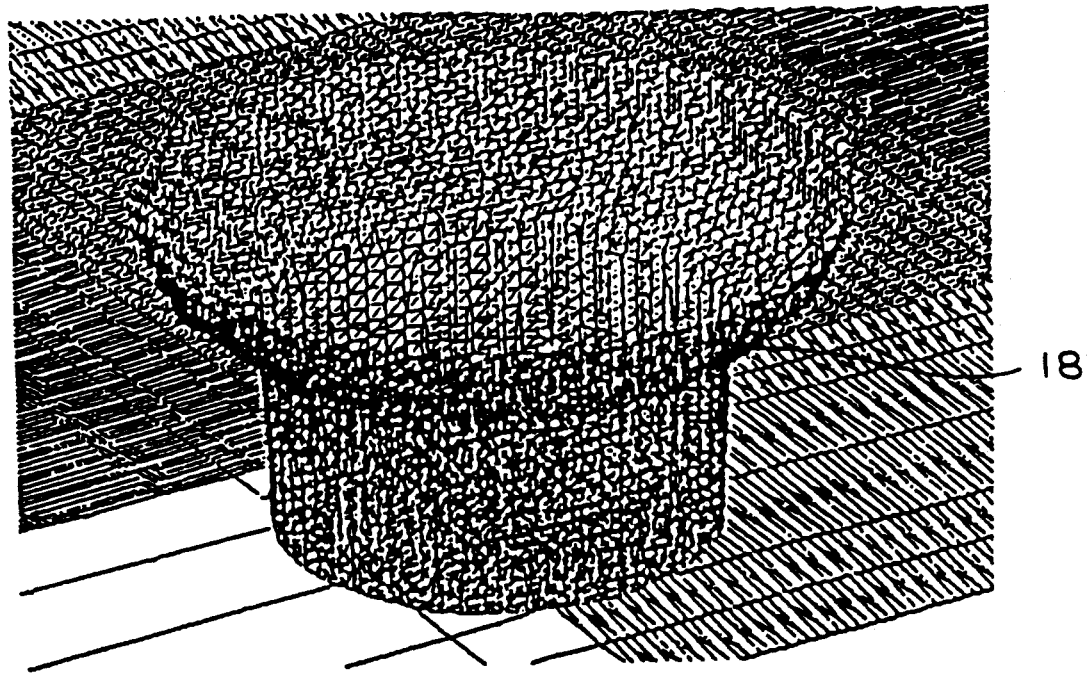
FIGS. 7A and 7B are respectively a perspective and a cross-sectional view of the simulation results of a dry-etched profile obtained in Example 1 which exemplifies the first embodiment of the present invention.
Figure 6B:
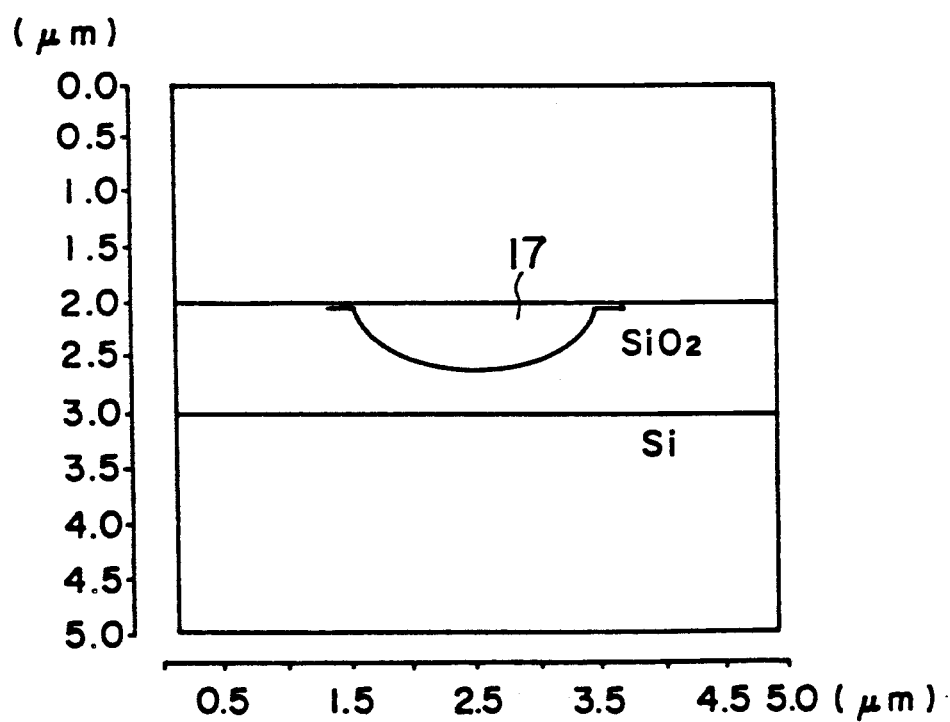
Figure 7B:
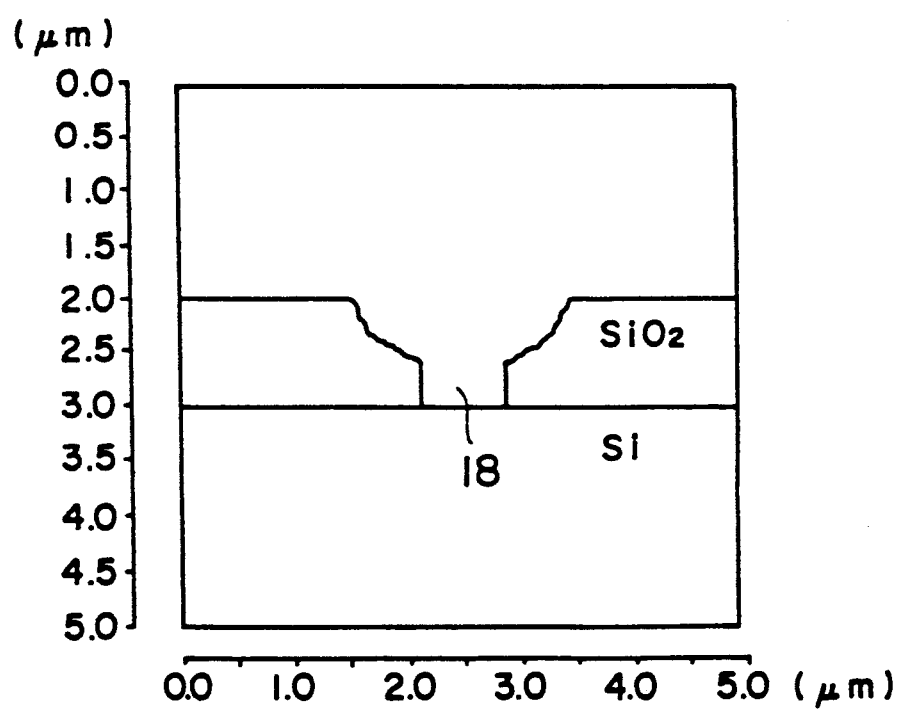

For the purpose of improving the coverage of aluminum wiring or the like, the contact hole in this example has a two-stage structure. The first stage is formed by performing wet etching, and the second stage is formed by dry etching. FIGS. 6A and 6B show the results of simulation of the three-dimensional shape of a contact hole 17 which is formed by wet etching. FIGS. 7A and 7B show the results of simulation of the three-dimensional shape of a contact hole 18 which is formed by dry etching the contact hole 17. FIGS. 6A and 7A are computer graphics.

When a computer having an ability of 15 MIPS was used, with 1 MIPS being a capability to process one million instructions per second, and when the number of mesh points, i.e., intersections, was 50,000, it took about 5 minutes for the computer to complete simulation of this example, which was a very short time.

EXAMPLE 2: GROOVE FORMATION ETCHING

Figure 8A:
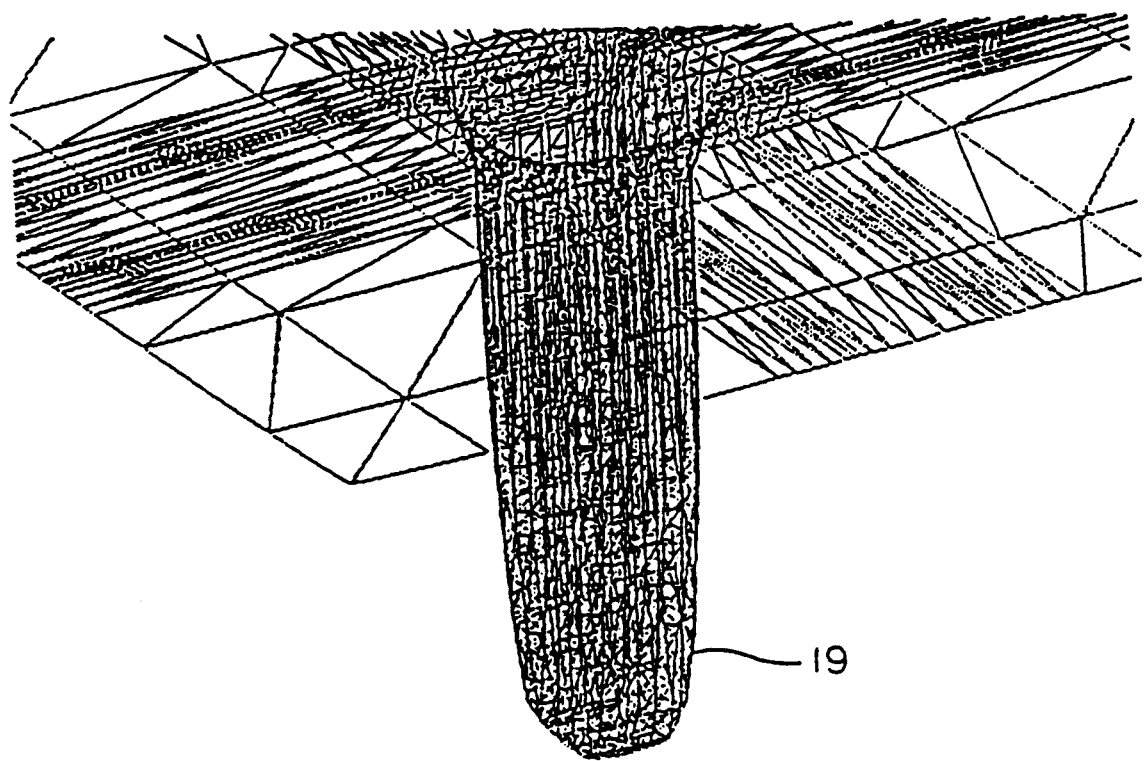
FIGS. 8A and 8B are respectively a perspective and a cross-sectional view of the simulation results obtained in Example 2 which also exemplifies the first embodiment of the present invention.
Figure 8B:
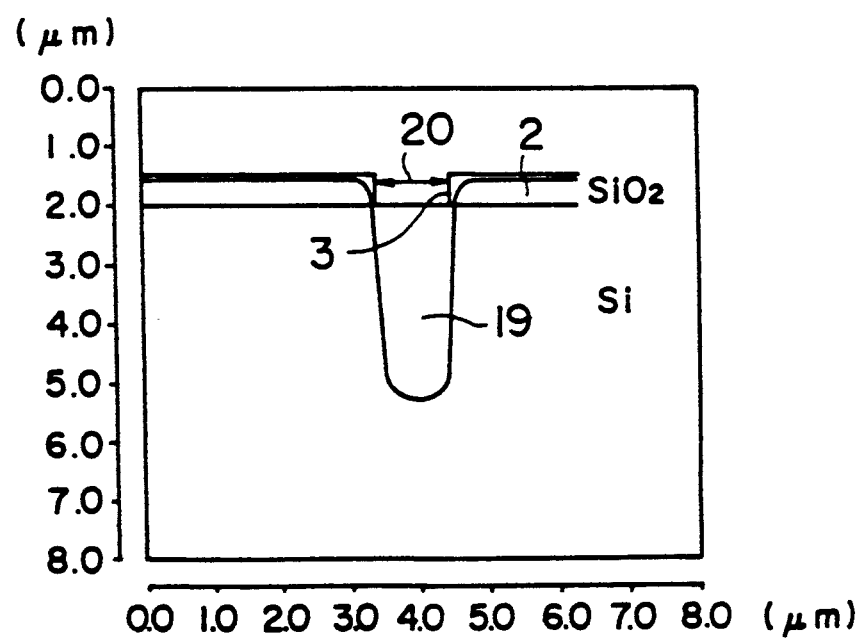

As device sizes shrink, use of the grooves formed in the semiconductor substrates in the longitudinal direction thereof, i.e., in the direction of their depth, for the separation of a semiconductor or a storage capacity increases. FIGS. 8A and 8B illustrate the results of simulation of the three-dimensional shape of such a groove 19 formed by dry etching.

It took about 3 minutes for the computer of 15 MIPS capacity to complete the simulation of formation of the groove 19 when the number of mesh points was about 20,000.

When a dimension 20 of the window 3 of the mask 2 where dry etching takes place is small, the depth of the groove 19 to be formed may become shallow. FIG. 9 illustrates the results of simulation of grooves 19a and 19b formed in the two windows of the mask 2 having different dimensions. Two windows 3a and 3b having dimensions 20a and 20b are formed in the mask 2. As shown in FIG. 9, the groove 19b formed in the smaller window 3b is simulated as being shallower than the groove 19a, as it will actually be.

Next, a second embodiment of a simulation method which is applied to a photolithographic process will be described.

In the photolithography, the pattern of a mask is transferred on a substrate by selectively removing photo resist from the substrate in a predetermined pattern. Basically, simulation of the photolithography is divided into (1) calculation of light intensity distribution, (2) calculation of exposure and (3) calculation of development.

Figure 10A:
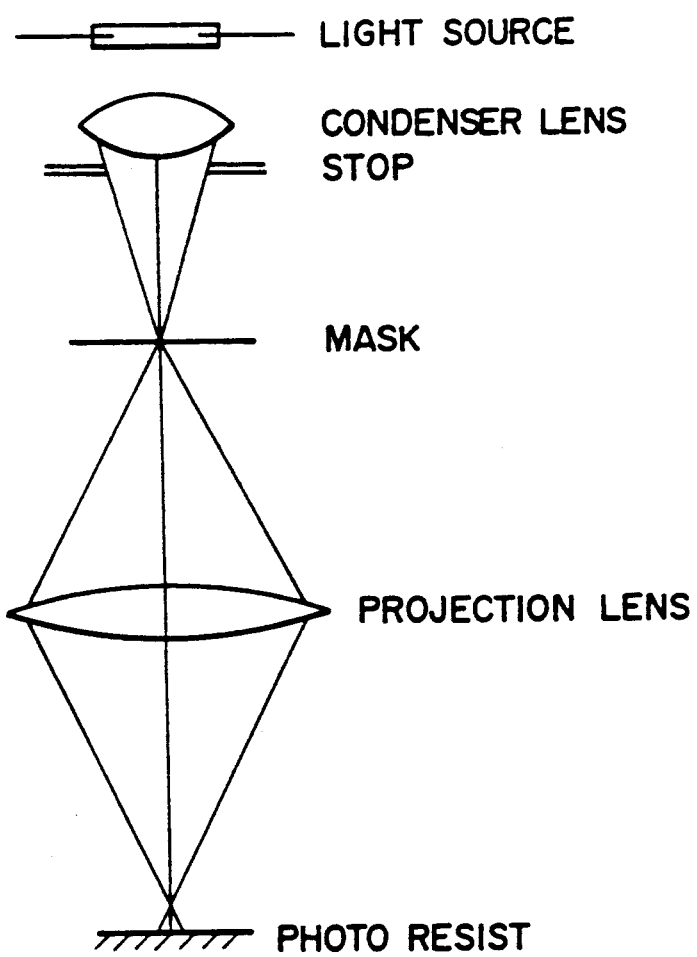
FIG. 10A is a schematic view of an exposure device employed in a second embodiment of the present invention.
Figure 10A:
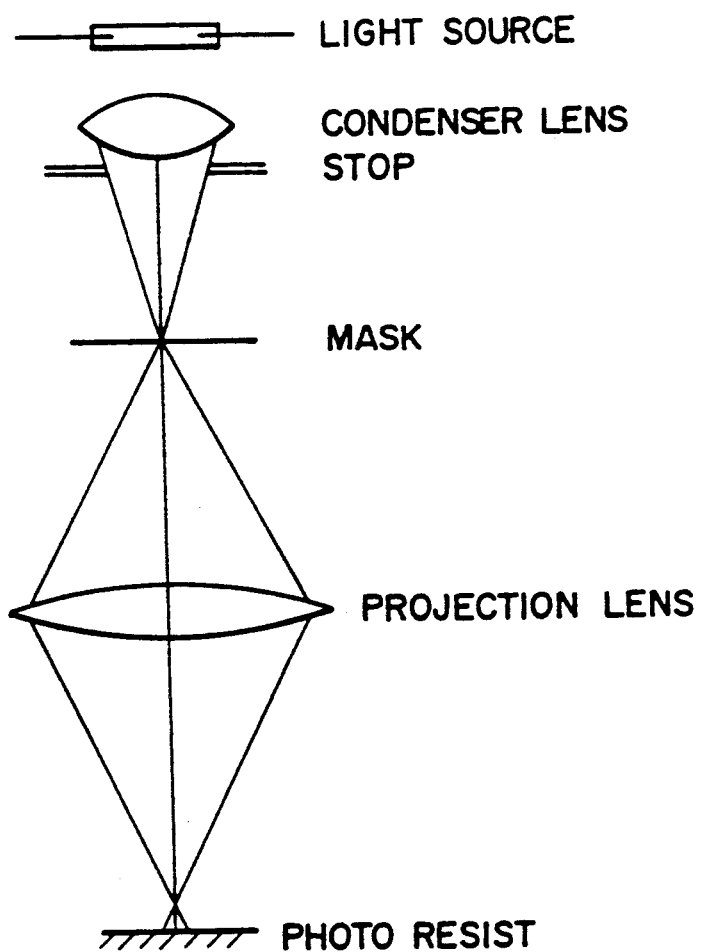

First, the two-dimensional light intensity distribution of the image, for example, of a mask pattern shown in FIG. 10B, which is formed on the surface of a photo resist using an exposure device as shown in FIG. 10A, is calculated in the manner shown in FIG. 10C.

Next, exposure calculation is performed

The complex index of refraction n of the photo resist is expressed as follows:

$$n = n-ik \quad [18]$$

$$k = \lambda/4\pi[AM(z,t)+B] \quad [19]$$

$$\partial M(z,t)/\partial t = -I(z,t)M(z,t)C \quad [20]$$

where n is the real part of the complex index n of refraction, A and B are exposure constants, M(z,t) is the concentration of a photosensitive agent in the photo resist, I(z,t) is the light intensity, and C is the optical sensitivity constant.

The concentration of the photosensitive agent, M(z,t), is obtained by discretely solving Equation [20] as follows:

$$M(z,t)|_{t=te+\Delta te} = M(z,t)|_{t=te} \exp[-I(z,t)|_{t=te} C\Delta te] \quad [21]$$

where I(z,t) is constant from $t=te$ to $t=te+\Delta te$.

Next, calculation of the light intensity I(z,t) will be described. Assuming that a photo resist 31 shown in FIG. 11 is divided into m layers in the direction of its depth z, that a substrate 32 located below the photo resist 31 is a m+1 th layer, and that the complex index of refraction, the reflectivity and the transmittance of the ith layer are ni, ri and ti, respectively, the following equations hold.

$$rm = \frac{n0 - nm + 1}{n0 + nm + 1} \quad [22]$$

$$tm = \frac{2(n0Re[nm+1])^{\frac{1}{2}}}{n0 + nm + 1} \quad [23]$$

$$rj - 1 = \frac{[\exp(-2i\phi j)](Fj - rj) - F(1 - Fjrj)}{Fj[\exp(-2i\phi j)](Fj - rj) - (1 - Fjrj)} \quad [24]$$

$$tj - 1 = \frac{(Fj^2 - 1)tj[\exp(-i\phi j)]}{Fj[\exp(-2\phi j)](Fj - rj) - (1 - Fjrj)} \quad [25]$$

where
$$Fj = (n0 - nj)/(n0 + nj) \quad [26]$$

$$\phi j = (2\pi/\lambda)nj\Delta zj \quad [27]$$

n0: The complex index of refraction of the surface layer of the photo resist 31
Δzj: The thickness of the jth layer.

The ratio of the energy Pj absorbed by the jth layer to that Pj-1 absorbed by the j-1th layer is expressed as follows:

$$\frac{Pj}{Pj-1} = \frac{|tj - 1|^2(1 - |rj|^2)}{|tj|^2(1 - |rj - 1|^2)} \quad [28]$$

In consequence, the absorbence Aj of the jth layer is expressed as follows:

$$Aj = [1 - Re(rj)][1 - Pj/Pj - 1]\pi Pq/Pq - 1 \quad [29]$$

where $2 \leq q \leq j - 1$. Using this absorbence Aj, the light intensity is expressed as follows:

$$I(z,t)|z = zj = I0Aj/(AMj + B)\Delta Zj \quad [30]$$

where IO is the light intensity on the surface of the photo resist 31.

Next, calculation of the developing velocity v(M) is performed. The developing velocity v(M), which is the Dill model, is expressed as follows using the concentration of the photosensitive agent M:

$$v(M) = A1\exp(E1 + E2M + E3M^2)/1000[\mu m/sec] \quad [31]$$

The Kim model of the developing velocity v(M) is expressed as follows:

$$v(M) = A2/\{[1 - \exp(-R3(1-M))]/R1 + [\exp(-R3(1-M))]/R2\}[\mu m/sec] \quad [32]$$

The developing velocity v(M) is calculated by Equation [31] or [32] using the concentration of the photosensitive agent M calculated by Equation [21], and the modified diffusion equations from [13] to [17] are solved using the developing velocity v(M) thus obtained in place of the etching velocity Vi obtained by Equation [13] employed in the first embodiment to achieve simulation of the shape of the photo resist 31.

Next, examples of the photolithographic simulations actually performed according to the second embodiment of the present invention will be described below.

EXAMPLE 3

Figure 12:
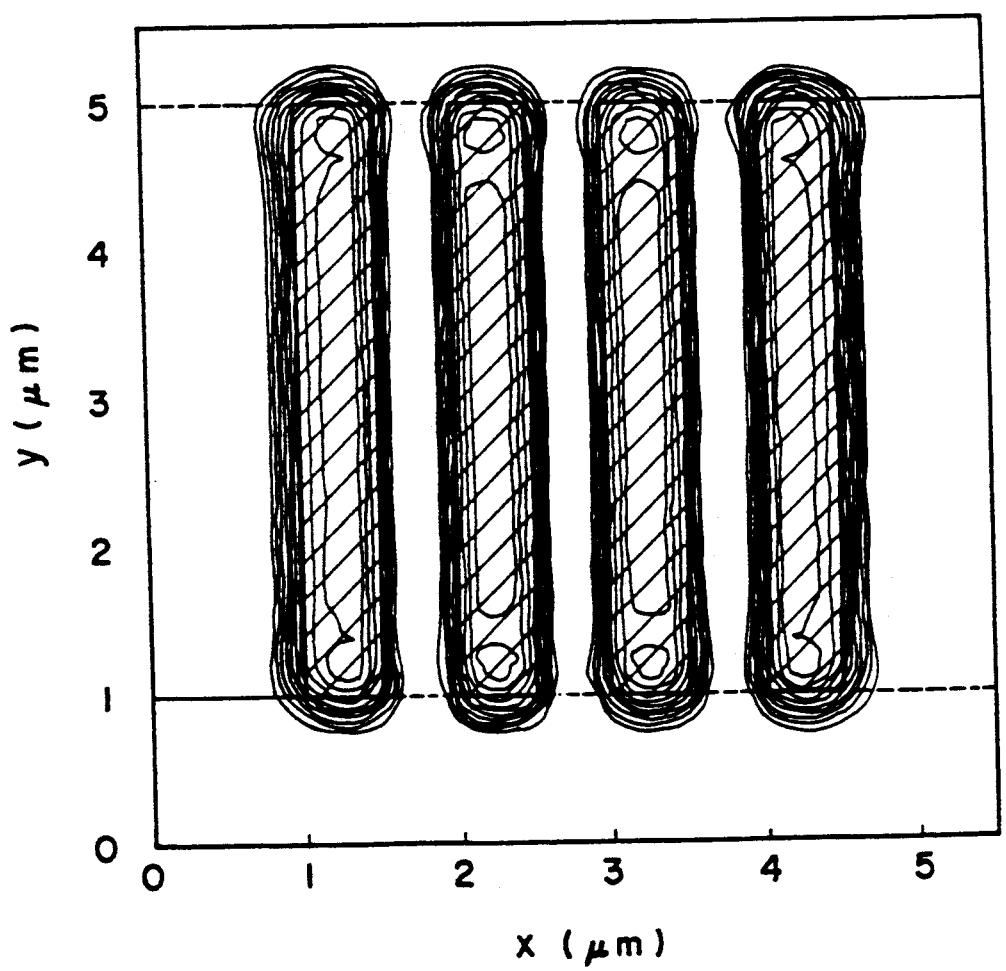
FIG. 12 shows the light intensity distribution obtained in Example 3 which exemplifies the second embodiment of the present invention.

Simulation of the photolithography which employed four rectangular masking portions having dimensions of 0.5 μm × 4.0 μm (left) was achieved. FIG. 12 shows the results of the calculation of the light intensity distribution on the surface of the photo resist. At this time, the parameters of the optical system were set as follows: the wavelength, 0.4358 nm; the amount of energy dosed, 150 mJ; NA (numerical aperture), 0.54; and coherence, sigma=0.5 and defocus=0.0.

Figure 13:
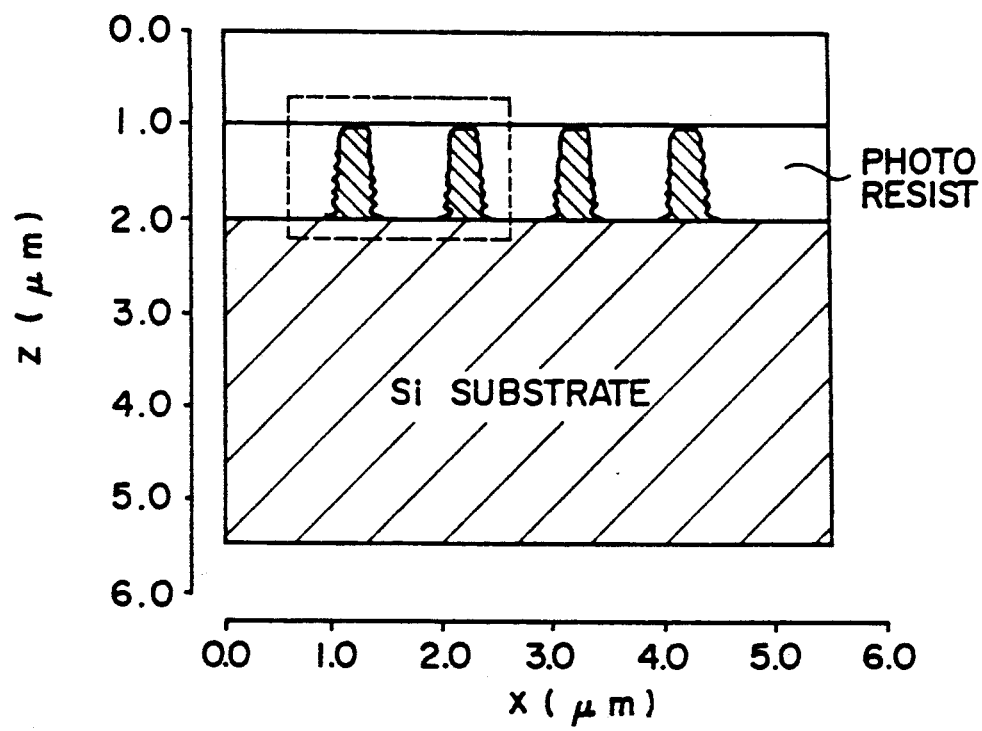
FIG. 13 is a cross-sectional view of the simulation results obtained in Example 3.
Figure 14:
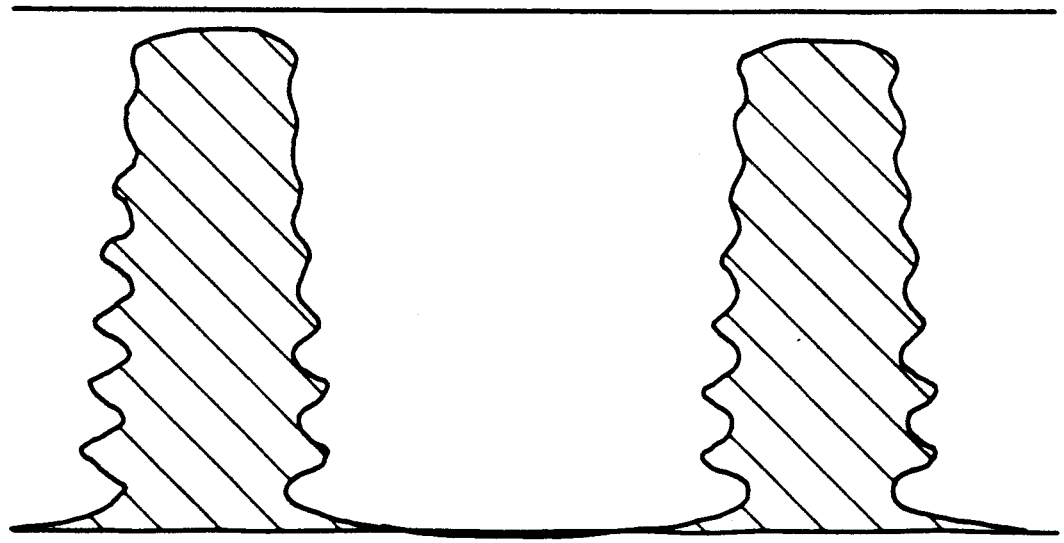
FIG. 14 is an enlarged view of the portion shown within the broken line in FIG. 13.

The shape of the photo resist was simulated by calculating the exposure and that of the development using the light intensity distribution thus obtained, as shown in FIGS. 13 to 15. The Kim model was used in the calculation of the development. FIG. 13 shows a section taken along x and z with y=2.75 μm. FIG. 14 is an enlarged view of the portion enclosed by the broken lines in FIG. 13. As can be seen from FIGS. 13 and 14, the incident light and the light reflected by the substrate interfere with each other, corrugating the shape of the resist. FIG. 15 is a perspective view of the shape of the resist. As shown in FIG. 15, the corners of the masked portions are round because of diffraction of the light.

EXAMPLE 4

Figure 16:
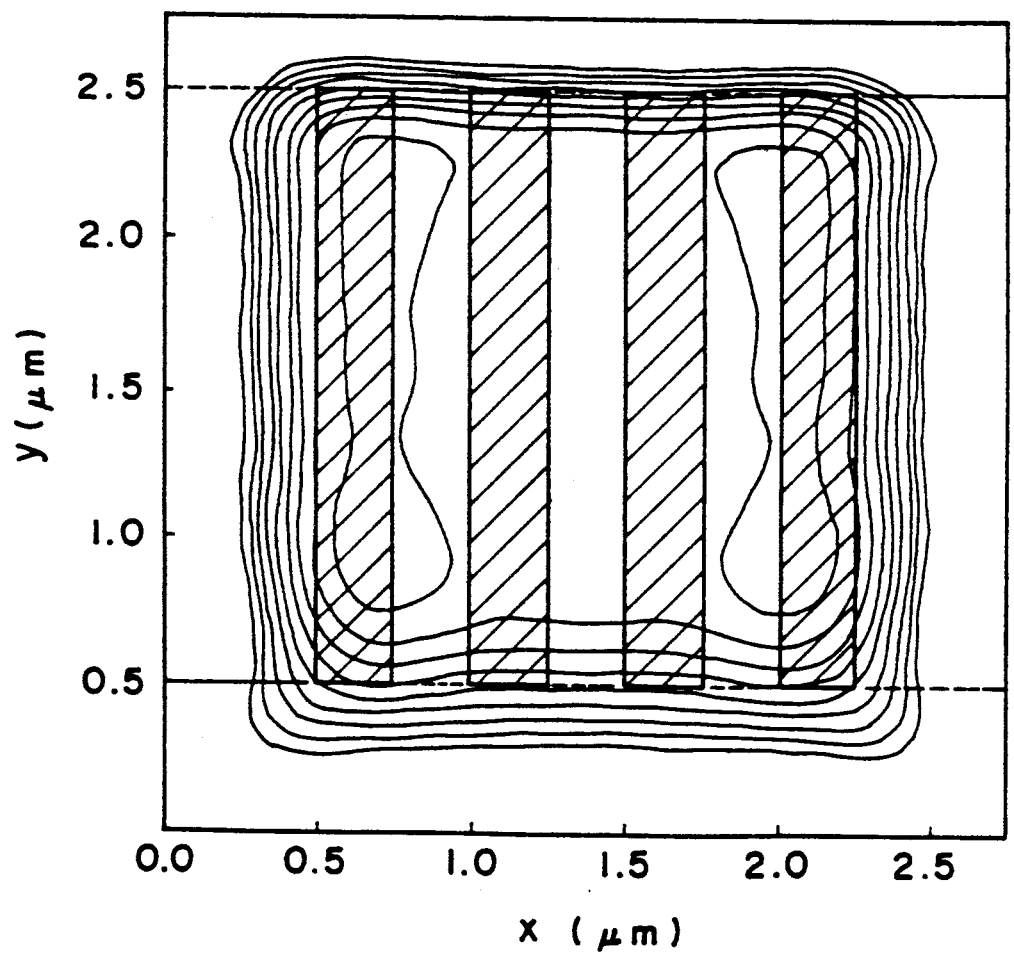
FIG. 16 shows the light intensity distribution obtained in Example 4 which also exemplifies the second embodiment of the present invention.

Simulation of photolithography which employed four rectangular masking portions having dimensions of 0.25 μm × 2.0 μm (left) was achieved. FIG. 16 shows the results of the calculation of the light intensity distribution on the surface of the photo resist. The parameters of the optical system were the same as those of Example 3. In Example 4, the width (0.25 μm) of each of the masking portions was too small to provide the light and dark portions in the light intensity distribution on the surface of the photo resist which correspond to the mask pattern, this forecasting that transfer of the mask pattern is impossible.

Figure 17:
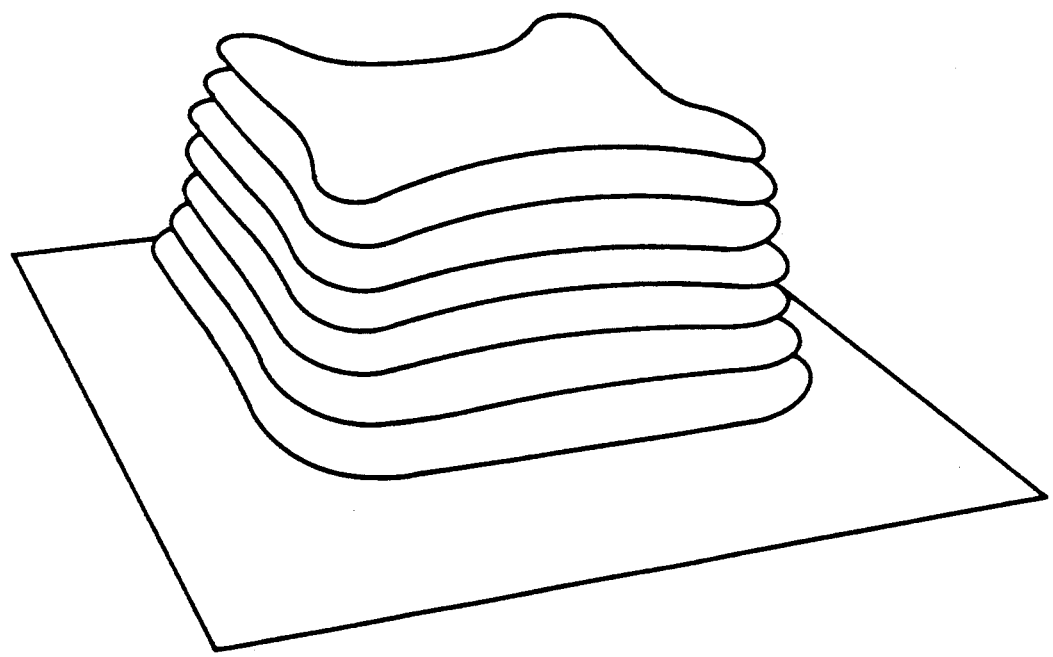
FIG. 17 is a perspective view of the simulation results obtained in Example 4.

The shape of the photo resist was simulated, as shown in FIG. 17, by calculating the exposure and that of the development using the light intensity distribution thus obtained. The Kim model was used in the calculation of the development. As can be seen in FIG. 17, the four separate lines of the mask pattern were connected with each other.

EXAMPLE 5

Figure 18:
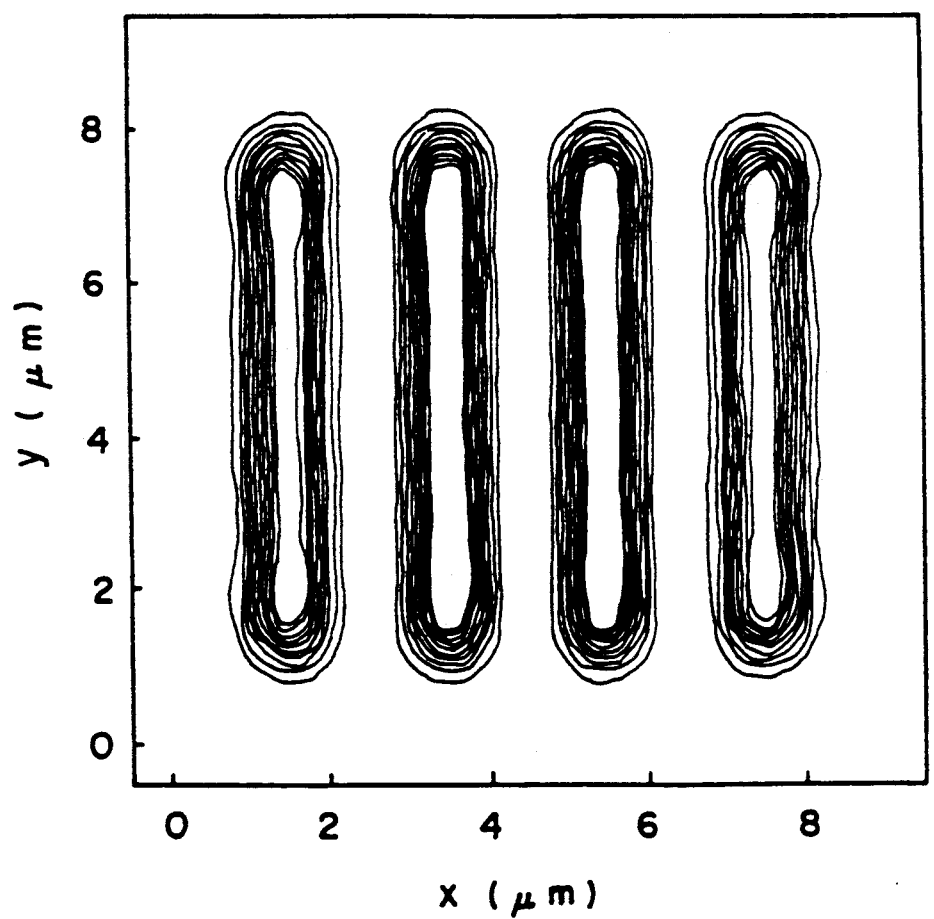
FIG. 18 shows the light intensity distribution obtained in Example 5 which also exemplifies the second embodiment of the present invention.

Simulation of the photolithography which employed four rectangular masking portions having dimensions of 1.0 μm × 7.0 μm (removed) was achieved. FIG. 18 shows the results of the calculation of the light intensity distribution on the surface of the photo resist. The parameters of the optical system were set as follows: the wavelength, 0.4358 nm; the amount of the energy dose, 80 mJ, NA (numerical aperture), 0.28; and coherence: sigma=0.0; defocus=0.0.

Figure 19:
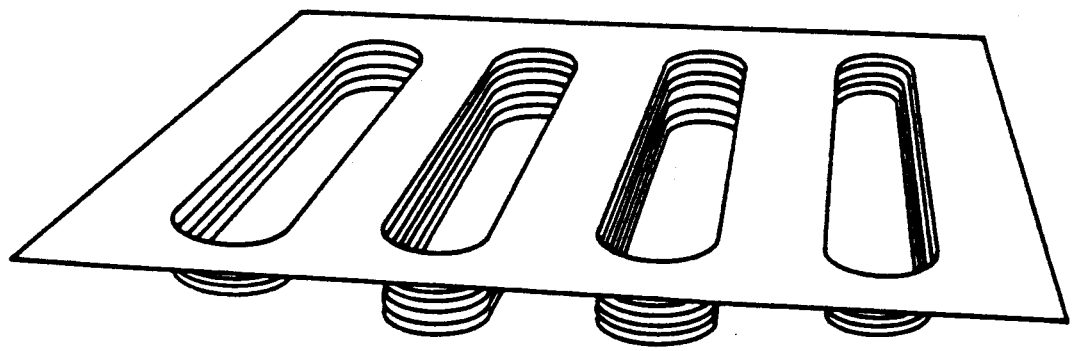
FIG. 19 is a perspective view of the simulation results obtained in Example 5.

The shape of the photo resist was simulated, as shown in FIG. 19, by performing the exposure and development calculations using the light intensity distribution thus obtained. The Dill model was used in the calculation of the development. The developing time lasted about 30 seconds. As can be seen in FIGS. 18 and 19, the developing velocity in the two central lines in the four lines of the mask pattern is higher than that in the other two lines located outside of the central two lines because of the diffraction of the light.

What is claimed is:

1. A method of predicting the three-dimensional shape of a surface of a workpiece from which material is removed by etching with an etchant comprising:

specifying a time T during which a workpiece will be exposed to an etchant;

establishing a three-dimensional grid of points;

specifying an initial three-dimensional shape of a surface of the workpiece that will be exposed to the etchant at each point on the grid of points;

specifying the initial concentration of the etchant at the surface of the workpiece that will be exposed to the etchant;

specifying the three-dimensional diffusion coefficient of the etchant;

specifying the three-dimensional etching rate of the workpiece at each location corresponding to a point on the grid of points;

successively solving the modified three-dimensional diffusion model equations for each of a plurality of time intervals representing etching of the workpiece beginning from the specified initial three-dimensional shape of the surface of the workpiece at the beginning of the first interval, the initial etchant concentration, the three-dimensional diffusion coefficient of the etchant, and the three-dimensional etching rates of the workpiece at each point on the grid of points to determine the shape of the etched surface of the workpiece at the end of each interval from the shape of the etched surface of the workpiece at the beginning of that interval by the finite difference method until the total length of the time intervals reaches the specified time T, thereby producing the final shape of the etched surface of the workpiece after etching with the etchant for the time T; and graphically displaying the shape of the workpiece after etching with the etchant for the time T.

2. A method of predicting the three-dimensional shape of a photolithographic mask disposed on a surface of a workpiece prepared by depositing a photoresist film on the surface of the workpiece, exposing parts of the photoresist film to light through a mask pattern, and developing the photoresist film by removing portions of the photoresist film exposed to light, thereby leaving the photolithographic mask in place on the surface of the workpiece comprising:

calculating the spatial intensity distribution of light incident on an exposed surface of a photoresist film disposed on a surface of a workpiece, the light originating from a source of light and passing through a mask pattern to reach the photoresist film;

calculating the three-dimensional exposure of the photoresist film within the photoresist film in response to the spatial intensity distribution of light incident on the surface of the photoresist film;

specifying a time T during which the photoresist film will be exposed to a developing agent;

establishing a three-dimensional grid of points;

specifying an initial three-dimensional shape of a surface of the photoresist film that will be exposed to a developing agent at each point on the grid of points;

specifying the initial concentration of the developing agent at the surface of the photoresist film that will be exposed to the developing agent;

specifying the three-dimensional diffusion coefficient of the developing agent;

specifying the three-dimensional development velocity of the photoresist film at each location corresponding to a point on the grid of points;

successively solving the modified three-dimensional diffusion model equations for each of a plurality of time intervals representing developing of the photoresist film beginning from the specified initial three-dimensional photoresist film shape at the beginning of the first interval, the initial developing agent concentration, the three-dimensional diffusion coefficient of the developing agent, and the three-dimensional development velocity of the photoresist film at each point on the grid of points to determine the shape of the developed surface of the photoresist film at the end of each interval from the shape of the developed surface of the photoresist film at the beginning of that interval by the finite difference method until the total length of the time intervals reaches the specified time T, thereby producing the final shape of the developed surface of the photoresist film after development with the developing agent for the time T; and graphically displaying the final shape of the photoresist film constituting a photolithographic mask after development with the developing agent for the time T.

* * * * *